United States Patent
Yanagida

[11] Patent Number: 5,877,078
[45] Date of Patent: Mar. 2, 1999

[54] METHOD OF MANUFACTURING A SEMICONDUCTOR DEVICE

[75] Inventor: Toshiharu Yanagida, Tokyo, Japan

[73] Assignee: Sony Corporation, Tokyo, Japan

[21] Appl. No.: 55,754

[22] Filed: Apr. 7, 1998

[30] Foreign Application Priority Data

Apr. 8, 1997 [JP] Japan .................................. 9-089778

[51] Int. Cl.⁶ .................................................. H01L 21/44
[52] U.S. Cl. .......................................... 439/612; 438/613
[58] Field of Search ................................ 438/612, 613, 438/614, 615, 616, 617

[56] References Cited

U.S. PATENT DOCUMENTS

| | | | |
|---|---|---|---|
| 5,034,345 | 7/1991 | Shirahata | 438/613 |
| 5,270,253 | 12/1993 | Arai et al. | 438/612 |
| 5,369,299 | 11/1994 | Byrne | 438/612 |
| 5,384,284 | 1/1995 | Doan et al. | 438/612 |

*Primary Examiner*—Kevin M. Picardat
*Attorney, Agent, or Firm*—Hill & Simpson

[57] ABSTRACT

For a resist pattern having an opening for defining a deposition position of a solder film pattern, a dewatering treatment is conducted while controlling the highest temperature to be reached on the surface of the wafer to lower than the heat resistant temperature of the resist pattern. The dewatering treatment is conducted by sputter etching, high vacuum annealing or drying in an inert gas atmosphere. Subsequently, a solder film is deposited over the entire surface of the wafer, the solder film deposited to the portion other than the inside of the opening is removed together with the resist pattern, and the remaining solder film pattern is finished by a heat melting treatment into a solder ball.

8 Claims, 5 Drawing Sheets

METHOD OF MANUFACTURING A SEMICONDUCTOR DEVICE

BACKGROUND OF THE INVENTION

1. Field of the Invention

The present invention relates to a method of manufacturing a semiconductor device for mounting a device chip by a flip-chip bonding method and more particularly to a method of enhancing the purity of a solder ball thereby improving the manufacturing yield of the device.

2. Description of Related Art

For further proceeding size-reduction of electronic equipment, it is important how to improve the density of mounting parts. Also for semiconductor IC, wireless bonding of directly connecting LSI bare chips to conductor patterns on a mounting substrate has been proposed instead of existent package mounting using bonding wires and a lead frame. Among all, a method of forming all electrode portions, solder balls (bumps) and beam leads connected thereto on the device-forming surface of a device chip and directly connecting the same to a conductor pattern on a mounting substrate with the device-forming surface being downward is referred to as a flip-chip bonding method and utilized generally in the mounting of hybrid IC or in application uses of large-scaled computers since assembling steps can be rationalized.

In particular, solder balls are expected to take an important position more and more as mounting terminals for BGA (ball grid array) packages which are promising as multi-pin packages in the feature. BGA means a technique of converting an arrangement pattern of Al electrode pads usually concentrated in the periphery of a device chip into a regular arrangement pattern of electric contacts distributed in a wider range by way of an insulative intermediate layer (interposer) and disposing solder balls to the electric contacts. Since a large arrangement pitch can be ensured between adjacent solder balls by BGA, there is no worry of short-circuit between the solder balls and, accordingly, a device chip can be mounted on a mounting substrate with a sufficient bonding strength without reducing the ball diameter.

In recent years, solder balls are sometimes formed by as much as 200 or more per one package, and the reliability of the mounting depends on how such a multiplicity of solder balls can be formed at a uniform height.

The solder balls have generally been formed by electrolytic plating but the method involves a problem that the thickness of a solder film to be formed fluctuates depending on the surface state of an underlying material layer and slight scattering of electric resistance.

For solving such a problem, the present applicant has already proposed a method of forming solder balls comprising a combination of a vacuum thin film-forming technique and lift off of a resist pattern in Japanese Patent Laid-Open Hei 7-288255 previously. The method will be explained with reference to FIG. 7 to FIG. 10.

Figure 7:
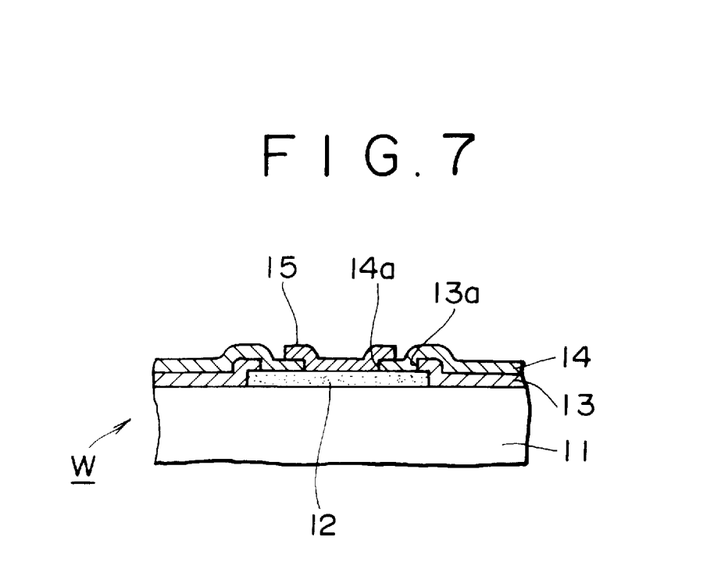
FIG. 7 is a schematic cross sectional view illustrating a state of forming a BLM film on an Al electrode pad in an existent process.

FIG. 7 shows a state of a wafer W in which a BLM film 15 is formed on an Al electrode pad 12 by way of passivation or a substrate 11, and a solder film pattern is formed by way of passivation by an organic protection film. ABLM (ball limiting metal) film is a sort of barrier metals formed with an aim of improving adhesion and prevention mutual of diffusion between the film and a solder film to be formed subsequently and this naming is derived from that the film determines the finished shape of a solder ball.

Referring simply to the steps so far, an Al electrode pad 12 is at first patterned to a predetermined shape on a substrate 11 in which all devices have been formed. Then, the entire surface of the wafer W is covered with an SiN passivation film 13, and the film was patterned to form an opening 13a facing the Al electrode pad 12. Subsequently, the entire surface of the wafer W is deposited with a polyimide film 14 as an organic passivation film, and an opening 14a facing the Al electrode pad 12 is formed further to the inside of the opening 13a.

Then, the BLM film 15 is formed so as to cover the opening 14a. The BLM film 15 is a multi-layered film comprising a Cr film, a Cu film, an Au film laminated by sputtering orderly from the lower layer, which is usually formed by a lift off method.

Figure 8:
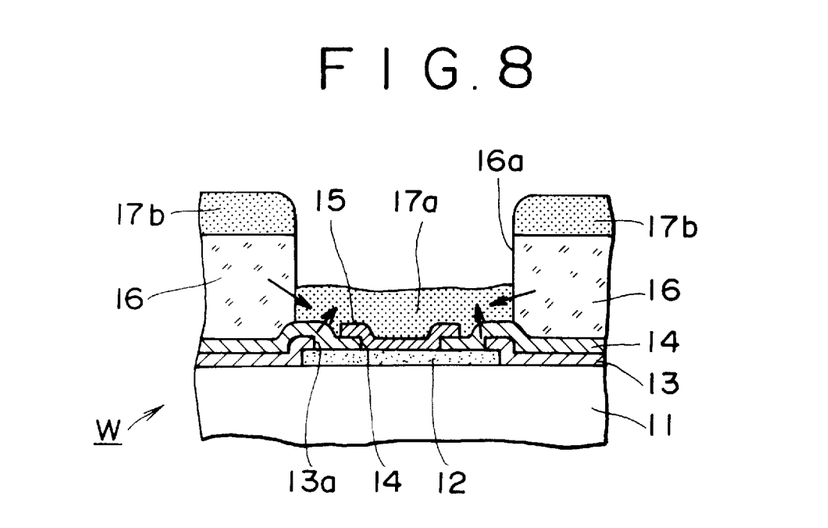
FIG. 8 is a schematic cross sectional view illustrating a state where water is taken from a resist pattern or polyimide film into a solder film pattern formed on the surface of the wafer in FIG. 7.

Then, a solder film pattern 17a is formed by a lift off method. At first, as shown in FIG. 8, a resist pattern 16 of a sufficient thickness having an opening 16a exposing the opening 14a and a region in the vicinity thereof is formed. Then, the entire surface of the wafer W is coated with a solder film. The solder film is formed at the inside of the opening 16a in contact with the BLM film 15 and separated into a solder film pattern 17a to form a solder ball in a subsequent step and an unnecessary solder film 17b deposited on the resist pattern 16 and to be removed in a subsequent step.

Figure 9:
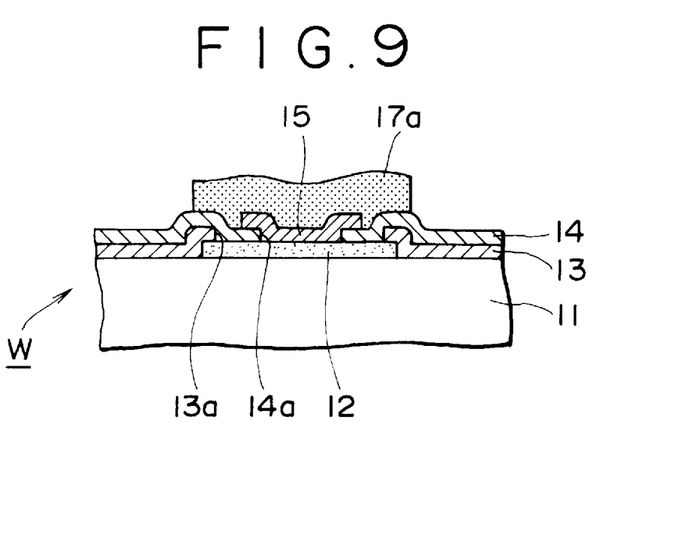
FIG. 9 is a schematic cross sectional view illustrating a state of lifting off the resist pattern in FIG. 8 and removing unnecessary portion of the solder film.

Successively, the substrate is immersed in a resist peeling solution and subjected to waving treatment under heating and, when the resist pattern 16 and the unnecessary solder film 17b are removed, a solder film pattern 17a remains as shown in FIG. 9.

Figure 10:
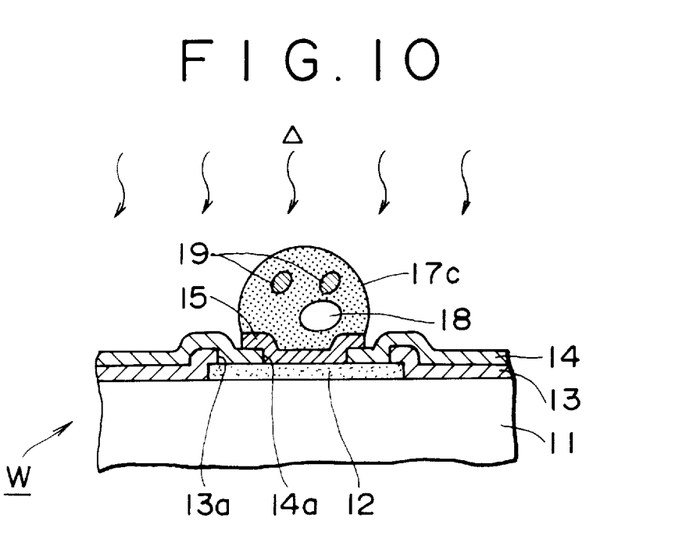
FIG. 10 is a schematic cross sectional view illustrating a state where voids or metal oxides are formed in the inside of the solder ball formed by the wet back.

Subsequently, a heat melting treatment referred to as wet back is applied. That is, after coating a flux on the surface of the solder film pattern 17a, when temperature is elevated stepwise in an $N_2$ atmosphere, the solder film pattern 17a shrinks by its own surface tension to form a solder ball 17c in a self-alignment manner on the BLM film 15 as shown in FIG. 10. The final temperature to be reached in the wet back is about 340° C.

Then, the wafer W is put to dicing, and when the solder ball forming surface of individual device chips divided from the wafer W are made downward and opposed to the mounting substrate, and the conductor pattern preliminarily soldered on the mounting substrate and the solder balls are aligned and heat melted, chip mounting is completed.

By the way, the thickness of the solder film pattern 17a that determines the size of the solder ball 17c is made sufficiently large with a view point of ensuring the bonding strength of the chip to the mounting substrate and the dimensional stability. The thickness is generally about 30 μm although depending on the arrangement pattern of balls. Accordingly, the film thickness of the underlying resist pattern 16 for lift off is desirably greater than 30 μm. The film thickness is several tens times as large as the thickness of the resist pattern used for the preparation of internal circuits of the device.

However, if the thickness of the resist pattern 16 is large as described above, a great amount of water derived from a liquid developer or cleaning water tends to be taken into the film after photolithography. Particularly, the water content taken into the deep inside of the film can not sufficiently be removed easily even by way of usual baking treatment. In addition, the resist pattern 16 may sometimes re-absorb moistures in air in the substrate cooling step after the baking treatment. If the solder film is to be vapor deposited in contact with the resist pattern 16 containing a great amount of residual water, a so-called degassing occurs in which water is gasified by the heating of the substrate upon vapor deposition and released from the resist pattern 16. The released water fluctuates the film-forming condition of the solder film and a portion of water is taken into the inside of the solder film pattern 17a as shown by arrows in the figure.

A portion of water taken into the solder film pattern 17a is also derived from a polyimide film as shown by arrows in the figure.

If wet back is applied to the solder film pattern 17a formed in such a situation, the water taken previously into the film may be gasified and expanded in the solder ball 10 to cause voids 18 or water may oxidize constituent elements of the solder film to locally deposit metal oxides 19. The voids 18 or metal oxides 19 increase the specific resistivity of the solder ball 17c after finishing or lower adhesion between the BLM film 15 and the solder ball to cause degradation of lower the manufacturing yield of the device.

SUMMARY OF THE INVENTION

Then, it is an object of the present invention to provide a method of manufacturing a semiconductor device capable of improving the manufacturing yield of the device by enhancing the purity of the solder ball after finishing also in a case of selectively depositing a solder film pattern by a lift off method using a resist pattern.

The foregoing object of the present invention is attained in the method of manufacturing a semiconductor device according to the present invention, attained in the course of a process of finishing a solder film pattern deposited selectively by a lift off method on an electrode pad of a device chip by way of wet back into a solder ball by conducting a dewatering treatment for the resist pattern before forming a solder film on the resist pattern for lift off.

In the present invention, since residual water is previously released by a dewatering treatment at least from an underlying resist pattern before vapor deposition of a solder film, degassing from the resist pattern does not occur caused upon vapor deposition of the solder. It is explained here as "at least from the resist pattern . . . ", because release of water from the insulative protection film exposed in the opening of the resist pattern (second opening) proceeds simultaneously depending on the condition of the dewatering treatment, as the insulative protection film, films of low dielectric constant materials proposed in recent years as interlayer insulation film materials can be used, for example, polyimide resin, polytetrafluoro ethylene dielectrics, fluorinated polyaryl ether derivatives, poly-p-fluorinated xylene or the like. Among them, the polyimide resin film has been used most popularly at present having high heat resistant as 400° C. or higher, and organic materials excellent in heat resistance, moisture resistance, cracking resistance and flatness, having small heat expansion coefficient and, further, also preferably having impurity gettering property may be properly selected and used.

According to the present invention, fluctuation of film forming conditions of the solder film and intrusion of water into the film can be suppressed, and deposition of metal oxides or formation of voids in the inside of the solder ball can also be prevented. As a result, the specific resistivity of the solder ball can be maintained low as per the designed value, and adhesion with the underlying material film is improved thereby improving the manufacturing yield of devices.

However, it is necessary that the dewatering treatment is conducted while controlling the highest temperature to be reached of the substrate to a temperature lower than the heat resistant temperature of the resist pattern. This is because the resist material is thermally denatured in a temperature region in excess of the heat resistant temperature of the resist pattern to cause a so-called scorching in which the material can not be peeled off the underlying insulative protection film. The temperature for the dewatering treatment in the present invention is suitably determined in a range of about 50° to 100° C., more preferably, 50° to 80° C., while depending on the combination of the base resin constituting the resist pattern or a plasticizer mixed therewith. If the temperature is lower than the range, the watering effect is insufficient, or a time required for the dewatering treatment has to be extended to greatly deteriorate the throughput. On the other hand, if the temperature exceeds the upper limit, it makes the peeling of the resist difficult by the scorching in the subsequent step as described above. Even if the temperature elevation does not directly lead to scorching, various change of physical properties of the resist pattern may be considered if the temperature exceeds the softening point of the base resin. Accordingly, accidental situations can be avoided if the temperature is within the above-mentioned range, even when the difference depending on the kind of the base resin is taken into a consideration.

Particularly, the heat resistant temperature of a resist material of high viscosity for forming a thick resist pattern as used in the lift off of the solder film as in the present invention is lower than the heat resistant temperature of the resist material used for the formation of circuit patterns in the device chip, and it is often at about 70° C. Accordingly, it is necessary to conduct the dewatering treatment to such a high viscosity resist material within a temperature range of 65° to 70° C.

The polyimide film used typically as the insulative protection film has much more excellent heat resistance compared with general resist materials, there is no worry of thermal denaturation at all within the above-mentioned temperature range.

As an actual means for the dewatering treatment, (a) sputter etching, (b) high vacuum annealing or (c) drying in an inert gas atmosphere is conducted in the present invention.

In the sputtering etching (a) above, water molecules which are adsorbed at the surface or taken into the inside of the resist pattern or the insulative protection film are dissociated by utilizing kinetic energy of ions incident to a substrate, or heat generated by energy conversion after incidence to the substrate. Since the sputtering etching is conducted under a plasma discharge condition, the temperature of the substrate is elevated by various factors such as heat transmission from a substrate stage of a sputtering device, plasma irradiation heat, conversion of kinetic energy of incident ions into thermal energy at the inside of the substrate. Accordingly, when dewatering is applied by sputter etching, it is necessary to optimize the plasma discharging condition such that the highest temperature to be reached on the surface of the substrate falls within the range described above. Plasmas used for the sputter etching are selected so as not to give adverse effects on the shape and the nature of the ion incident surface. Ar plasmas are used typically.

By the way, there is no particular restriction on plasma apparatus for conducting the sputter etching and, for example, a parallel plate type RF plasma apparatus and a magnetron RIE apparatus used so far can be adopted. However, since a ratio frequency power determining the plasma density and a bias voltage determining the incident ion energy are controlled while being kept at a predetermined correlationship in these devices, if the plasma density is increased, the substrate bias is increased correspondingly. Accordingly, there is a limit of rapid removal of residues while suppressing damages to the organic protection film.

On the contrary, in a plasma apparatus capable of controlling the plasma excitation and the substrate bias independently, since plasmas at a high density can be formed at a lower voltage, residues can be removed rapidly by using a great amount of ions while keeping the kinetic energy of ions incident to the surface organic protection film to an appropriate value. The apparatus of this kind can include, for example, a triode type RF plasma apparatus, a magnetic field, microwave plasma apparatus, an ICP (Induction Coupling Plasma) device and a helicon wave plasma apparatus. In the triode type RF plasma apparatus, a plasma density at an order of $10^{10}/cm^3$ can be attained. Apparatus capable of attaining the plasma density at an order of $1\times10^{11}/m^3$ or higher are collectively referred to particularly as a high density plasma (HDP) apparatus in recent years and it is possible to excite plasmas with the density at the order of $10^{11}/cm^3$ in the magnetic field microwave plasma apparatus, $10^{12}/cm^3$ in the ICP apparatus and $10^{13}/cm^3$ in the helicon-wave plasma apparatus.

When dewatering is applied by sputter etching, scams of the resist film, if remain in the opening of the resist pattern, that is, in the second opening, can be eliminated simultaneously.

Scams are residues of the resist film caused by resolution failure or development failure in photolithography. In the lift off method, the thickness of the resist film used is extremely large, as described above, while the focal depth in the photolithography becomes extremely shallow along with the shortening of the exposure wavelength. Accordingly, scams tend to be formed even by slight fluctuation of exposure conditions or the development conditions. Then if they remain on the surface of the underlying material film to form the solder film pattern, they cause increase in the contact resistance between the solder ball and the underlying material film or contact failure. Sputter etching is effective as a means for physical elimination of the scams.

The high vacuum annealing (b) described above is a method of dissociating water in the film while heating the substrate under high vacuum. On the other hand, in the leaving of the substrate in a dry inert gas atmosphere of the method (c) above, the substrate may not be heated particularly while this depends on the time of leaving. As the dry inert gas, a dry $N_2$ gas can be used typically.

In the methods (b) and (c), since no physical energy is applied to the film as in the sputter etching (a) described above in the course of dewatering, dewatering with less damages is possible. If it is intended to remove the scams, sputter etching may be conducted successively after the high vacuum annealing. By applying dewatering and scam removing under independent conditions, optimal conditions for each of the procedures can be set easily to improve the process accuracy.

DESCRIPTION OF THE PREFERRED EMBODIMENTS

Preferred embodiments of the present invention will be explained below.

Example 1

A process of conducting a dewatering treatment before deposition of a solder film by using a triode type RF plasma processing apparatus will be explained with reference to FIG. 1 to FIG. 6.

Figure 1:
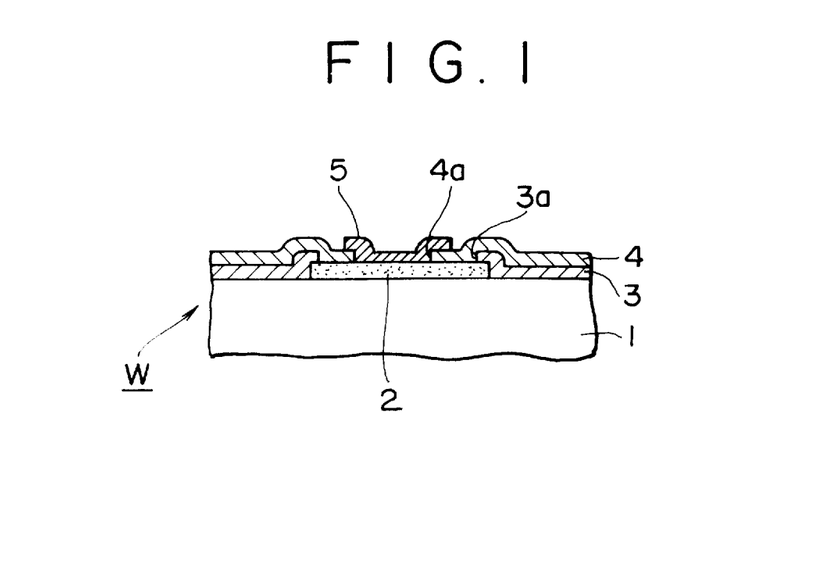
FIG. 1 is a schematic cross sectional view illustrating a state of forming a BLM film by way of patterning of an SiN passivation film and a polyimide film on an Al electrode pad on a substrate.

At first, as shown in FIG. 1, an Al electrode pad 2 is patterned on a substrate 1 in which formation of all devices was completed. Successively, the entire surface of the substrate was covered with an SiN passivation film 3 to be formed, for example, by a plasma CVD method and, further, the film was patterned to form an opening 3a so as to expose the Al electrode pad 2. The thus attained state is a completed state of a usual device chip.

Then, a photosensitive polyimide resin (manufactured by Toray Industries, Inc.: trade name, UR-3100, specific dielectric constant $\epsilon\approx3.2$) was coated to a thickness of about 5 $\mu$m over the entire surface of the substrate (wafer) to form a polyimide film 4. Then, the polyimide film 4 was patterned by way of g-ray photolithography and development to form an opening 4a as a first opening for exposing the Al electrode pad 2. The opening 4a is formed to the inside of the opening 3a of the SiN passivation film 3 formed previously and defines a contact area between the Al electrode pad 2 and a BLM film to be formed in the subsequent step.

Then, a BLM 5 in contact with the exposed surface of the Al electrode pad 2 was formed so as to cover the opening 4a. A lift off method was applied for the formation. That is, a not-illustrated resist pattern which was opened corresponding to the portion for forming the BLM film 5 was formed and, successively, a pretreatment was conducted for removing spontaneous oxide film on the surface of the Al electrode pad 2. Then, a Cr film (about 0.1 $\mu$m thickness), a Cu film(about 1.0 $\mu$m thickness) and an Au film (about 0.1 $\mu$m thickness) were successively sputter to form a film, for example, by DC sputtering. The film forming conditions were set, for example, as shown below:

| Cr film: | Ar flow rate | 75 SCCm |
| --- | --- | --- |
| | Pressure | 1.0 Pa |
| | DC power | 3.0 kW |
| | Substrate temperature | room temperature |
| Cu film: | Ar flow rate | 100 SCCm |
| | Pressure | 1.0 Pa |
| | DC power | 9.0 kW |
| | Substrate temperature | room temperature |
| Au film: | Ar flow rate | 75 SCCm |
| | Pressure | 1.5 Pa |
| | DC power | 3.0 kW |
| | Substrate temperature | room temperature |

In this example, the Cr film of the lowermost layer functions as an adhesion layer to the electrode pad usually formed by using an Al series metal film, the Cu film of the intermediate layer functions as an anti-diffusion layer for the solder ball constituent metal and, further, the Au film of the uppermost layer functions as an antioxidant film for the Cu film respectively. The BLM film 5 was formed in a state separated above and below the resist pattern.

Then, the wafer W was immersed in a resist peeling solution to apply heating-shaking treatment. The resist peeling solution was prepared, for example, by mixing dimethylsulfoxide (DMSO) and N-methyl-2-2-pyrrolidone ($CH_3NC_4H_6O$). As a result, along with peeling of the resist pattern, unnecessary BLM film deposited thereon was removed simultaneously to leave only the BLM film 5 to be connected with the Al electrode pad 2. FIG. 1 shows the state of completing the steps up to this stage.

Figure 2:
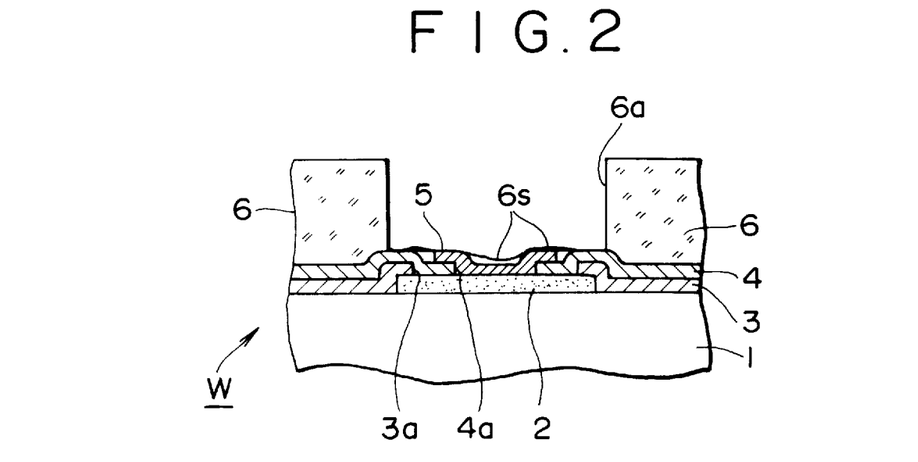
FIG. 2 is a schematic cross sectional view showing a state of forming a resist pattern for defining a deposition portion of a solder film on the wafer in FIG. 1.

Then, as shown in FIG. 2, a resist film was formed over the entire surface of the wafer W and a resist patterning was conducted for defining the deposition portion of the solder film. By the patterning, a resist pattern 6 having an opening 6a for exposing the region forming the opening 4a together with a peripheral region thereof. The thickness of the resist pattern 6 was made sufficient to separate the solder film in the succeeding step, for example, to 30 μm.

However, such a thick resist film was in a state of taking in a great amount of water derived from the liquid developer or cleaning liquid in the course of the developing step and the washing step, or water re-absorbed in the subsequent course of leaving in atmospheric air. Further, it is also difficult to completely remove the resist film in the inside of the opening 6a by development, and some scam 6s was left on the bottom of the opening 6a.

Figure 3:
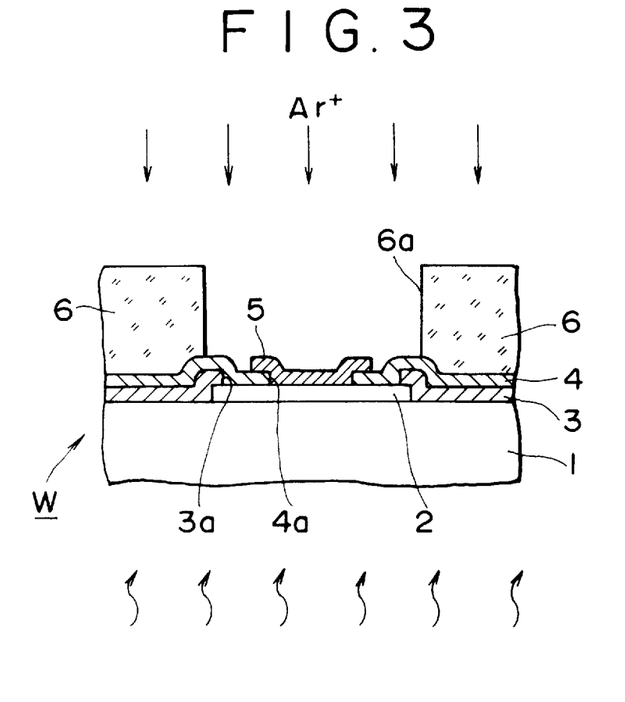
FIG. 3 is a schematic cross sectional view illustrating a state of applying a dewatering treatment and scam removing for an exposed portion of the resist pattern and the polyimide film shown in FIG. 2.

Then, as a step characteristic to the present invention, a dewatering treatment for the resist pattern 6 was conducted. In this embodiment, the wafer W was set on a wafer stage of a triode type RF plasma processing apparatus, and sputter etching was applied as shown in FIG. 3.

The triode type RF plasma apparatus comprises a three-electrode constitution in which an upper electrode (anode) and lower electrode (cathode) also serving as a wafer stage are opposed, and a grid electrode is disposed between both of the electrodes in a plasma chamber. An RF power source for plasma excitation is connected with the upper electrode and an RF power source for application of a substrate bias is connected with the lower electrode respectively, so that the plasma density and the substrate bias can be controlled independently. Plasmas are formed by glow discharge generated between the upper electrode and the grid electrode set to the ground potential, and positive ions passing through the grid electrode are led out to the lower electrode.

Example of sputter etching conditions in this embodiment is shown below.

| Apparatus | Triode type RF plasma apparatus |
| --- | --- |
| Ar flow rate | 25 SCCm |
| Pressure | 0.7 Pa |
| Source power | 600 W (2 MHz) |
| Bias power | 250 W (13.56 MHz) |
| Wafer stage temperature | 25° C. |
| Processing time | 60 sec |

In the process of the sputter etching, the highest temperature to be reached on the wafer surface was elevated to about 70° C. by the mechanism of heat conduction from the wafer stage heated under temperature control, heat of plasma radiation, and heat energy conversion of ion incident energy. While it is illustrated in FIG. 3 as if the heat energy Δ were given to the wafer W only from the lower surface thereof, this expression is only for the sake of convenience. Water taken into the deep inside of the resist pattern 6 was released efficiently by the temperature elevation, and the temperature at such a level causes no thermal denaturation of the resist pattern 6 at all. Simultaneously, all of scams 6s remained on the bottom of the opening 6a and not illustrated spontaneous oxide films formed on the surface of the BLM film 5 were removed by the ion sputtering effect. Further, water was released also from the polyimide film 4 by the plasma processing.

Figure 4:
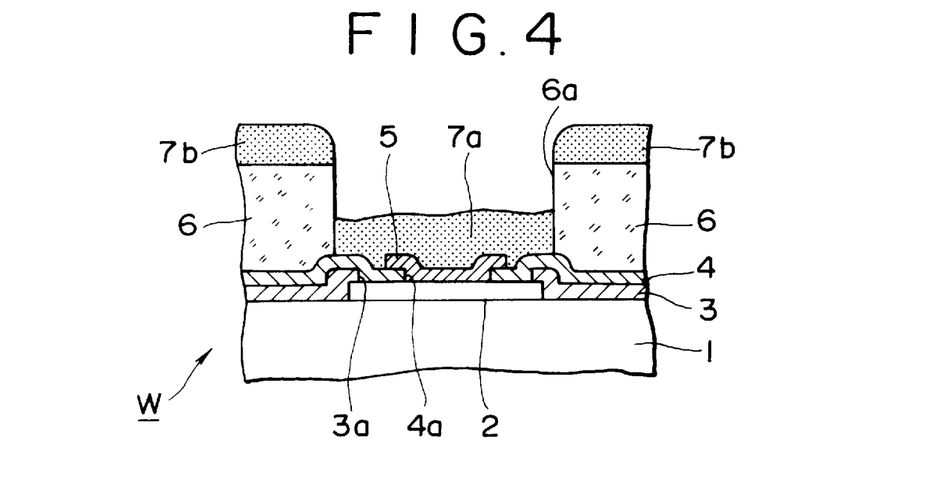
FIG. 4 is a schematic cross sectional view illustrating a state of forming a solder film on the wafer shown in FIG. 3.

Successively, as shown in FIG. 4, a solder film (97%Pb –3%Sn) was vapor deposited on the surface of the wafer W. The solder film was separated in a self-alignment manner vertically by the resist pattern 6, and the solder pattern 7a to be connected with the BLM film 5 was deposited in the opening 6a, while unnecessary solder film 7b was deposited on the resist pattern 6.

In the process of the vapor deposition, while the temperature of the wafer W was elevated to about 60° C., since water was previously released sufficiently from the resist pattern 6 and the polyimide film 4 by the dewatering treatment as described above, no fluctuation occurred in the vapor deposition atmosphere by degassing and stable film formation could be conducted.

Figure 5:
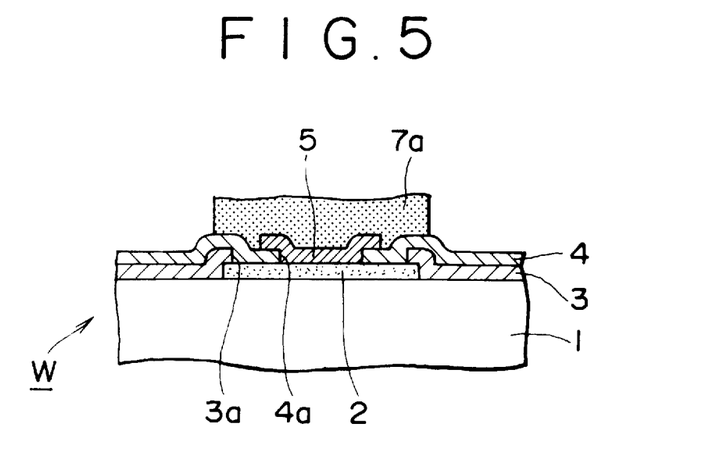
FIG. 5 is a schematic cross sectional view illustrating a state of lifting off the resist pattern in FIG. 4 and removing an unnecessary portion of a solder film.

The wafer W was again dipped in the resist peeling solution to apply a heating/shaking treatment to remove the resist pattern 6 and the unnecessary solder film 7b. Thus, as shown in FIG. 5, only the solder film pattern 7a covering the BLM film 5 was left. All of the resist pattern 6 were removed rapidly and no peeling failure due to scorching was observed.

Figure 6:
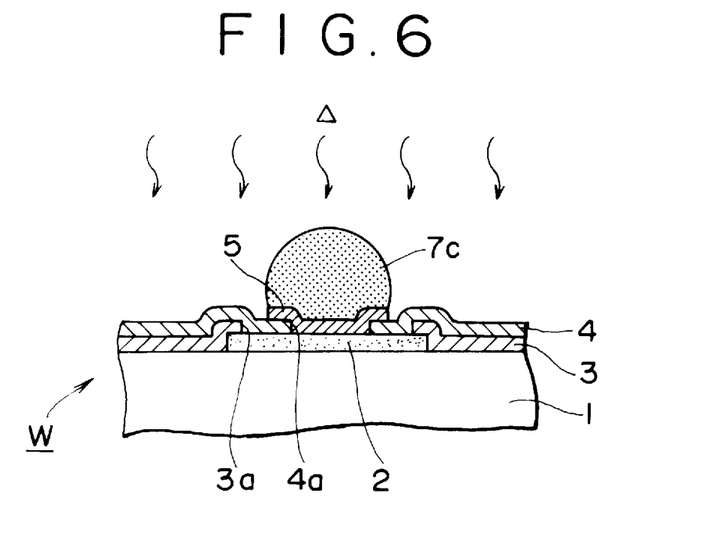
FIG. 6 is a schematic cross sectional view illustrating a state of forming a solder ball by a wet back.

Subsequently, a solder ball was formed by way of a so-called wet back step. Namely, a flux was at first coated to the patterned solder film 7a. The flux comprises resins such as an amine type activator, an alcoholic solvent, a rosin and a polyglycol as main ingredients and has an effect of reduction and surface activation of the solder film 7a. When the temperature of the wafer W in this state was elevated stepwise in an $N_2$ atmosphere, the solder film 7a shrinks spherically by its own surface tension while melting. As a result, a solder ball 7c as shown in FIG. 6 was formed. Formation of voids or segregation of the metal oxides as in the prior art was not observed in the inside of the ball 7c, and a resistance value as per the designed value was obtained. Further, adhesion between the solder ball 7c and the BLM film 5 was also satisfactory.

Subsequently, the wafer was applied with dicing and divided into individual chips, and the solder ball 7c and a previously soldered conductor pattern on a mounting substrate were fused by heating while aligned being positionally alighted, to complete mounting of an LSI chip.

The thus completed mounting products have improved mechanical strength and electric characteristic in the ball bonded portion due to enhanced purity of the solder ball 7c. Accordingly, reliability, durability and manufacturing yield of final mounting products were remarkably improved compared with those by the existent process.

Example 2

In this example, a dewatering treatment by high vacuum annealing and sputter etching by an ICP (induction coupled plasmas) apparatus were conducted continuously as a pre-treatment for forming a solder film pattern.

In the ICP apparatus, an upper electrode (anode) also serving as an upper lid in the plasma chamber and a lower electrode (cathode) also serving as a wafer stage are opposed to each other, and the outer circumference of an insulation wall constituting a portion of the lateral side wall surface of the plasma chamber was wound around with a multi-turn antenna. An RF power source for plasma excitation was connected to the multi-turn antenna, and an RF power source for application of a substrate bias was connected to the lower electrode, respectively, making it possible to control the plasma density and the substrate bias independently.

In this example, steps up to the formation of the opening 6a were the same as those described in Example 1, and the successive high vacuum annealing was conducted under the following conditions.

| | |
|---|---|
| Ar flow rate | 100 SCCm |
| Pressure | 2 Pa |
| Wafer stage temperature | 65° C. |
| Processing temperature | 120 sec |

Further, the sputter etching was conducted under the following conditions

| | |
|---|---|
| Apparatus | ICP apparatus |
| Ar flow rate | 100 SCCm |
| Pressure | 0.7 Pa |
| Source power | 1 kW (450 MHz) |
| RF bias voltage | 60 V (13.56 MHz) |
| Wafer stage temperature | 65° C. |
| Processing temperature | 20 sec |

In this example, the dewatering treatment was conducted mainly by high vacuum annealing, and sputter etching was conducted mainly with an aim of removing scams while it partially enables the dewatering treatment. In this way, the processing accuracy was improved by conducting the dewatering treatment and scam removal, respectively, under optimized conditions.

The ICP processing apparatus used herein can obtain a plasma density at an order as high as $10^{12}/cm^3$ by increasing the dissociation efficiency of gas molecules even under a low pressure of less than 1 Pa, and can enter $Ar^+$ ions formed in a great amount substantially vertically to the wafer W while minimizing the scattering of the ions. Accordingly, the scams 7s can be removed efficiently without increasing the bias voltage so high and a low damage process was attained.

Subsequently, formation of the solder ball 7c and mounting of LSI chip were conducted in the same manner as in Example 1, and improvement for the mechanical strength and the electric characteristics in the ball bonded portion was confirmed.

Example 3

In this example, the wafer W was left in a dry inert gas atmosphere to conduct dewatering treatment and then scams were removed by sputter etching as a pre-treatment for forming a solder film pattern.

Concretely, dry $N_2$ gas was sealed at a normal temperature in a chamber capable of maintaining the wafer temperature at 65° C., and the wafer W in the state shown in FIG. 2 was left in this atmosphere for 2 hours. While this method requires a longer processing time compared with other examples, since plasmas are not used at all, it has an advantageous effect of not causing plasma radiation damages at all.

Also in this example, improvement for the mechanical strength and the electric characteristics were confirmed in the ball bonded portion of final mounting products.

The present invention has been explained with reference to three types of examples but the present invention is not restricted to such examples at all. For example, as the plasma apparatus used for the dewatering treatment or the scam removal, there can be used the triode type RF plasma apparatus or ICP apparatus as described above, as well as an existent type plasma apparatus such as a parallel plate type RF plasma apparatus or a high density plasma apparatus such as a helicon wave plasma apparatus may also be used an ECR plasma apparatus.

The sputter etching using the above-mentioned plasma apparatus is preferably conducted at the timing just before the subsequent vapor deposition of the solder film. Use of a multi-chamber type manufacturing apparatus capable of high vacuum transportation of wafers between the chamber for the plasma apparatus conducting sputter etching and a film-forming chamber of a vapor deposition apparatus is extremely effective in view of preventing re-absorption of water by the resist pattern.

In addition, details for the constitution of the sample wafer to be used, film forming conditions, kind and thickness for each of the material films and sputter etching conditions can be properly changed, selected and combined.

As apparent from the foregoing explanations, according to the present invention, mechanical and electrical reliability of ball bonded portions can be improved and the manufacturing yield of the mounting products can be improved by enhancing the purity of the solder ball used for flip chip bonding.

Accordingly, it is possible by the present invention to manufacture a semiconductor device mounted at a high density with device chips capable of high speed operation and excellent in reliability and durability.

What is claimed is:

1. A method of manufacturing a semiconductor device comprising:
    a first step of forming a first opening for exposing an electrode pad to an insulative protection film covering a device chip;
    a second step of forming a resist pattern having a second opening on the insulative protection film for exposing a region for forming the first opening together with a region in the vicinity thereof;
    a third step of applying a dewatering treatment at least to the resist pattern while controlling the highest temperature to be reach on the surface of a substrate to a temperature lower than the heat resistant temperature of the resist pattern;

a fourth step of selectively depositing a solder film pattern in a region corresponding to the second opening by a lift off method using the resist pattern; and a fifth step of deforming and shrinking the solder film pattern by a heat treatment thereby forming a solder ball.

2. A method of manufacturing a semiconductor device as defined in claim 1, wherein the dewatering treatment is conducted by sputter etching in the third step.

3. A method of manufacturing a semiconductor device as defined in claim 1, wherein the dewatering treatment is conducted by high vacuum annealing in the third step.

4. A method of manufacturing a semiconductor device as defined in claim 3, wherein sputter etching is conducted succeeding to the high vacuum annealing.

5. A method of manufacturing a semiconductor device as defined in claim 1, wherein the dewatering treatment is conducted by leaving a substrate in a dry inert gas atmosphere in the third step.

6. A method of manufacturing a semiconductor device as defined in claim 5, wherein the sputter etching is conducted succeeding to the leaving of the substrate in the third step.

7. A method of manufacturing a semiconductor device as defined in claim 1, wherein the highest temperature to be reached is controlled within a range from 50° to 100° C.

8. A method of manufacturing a semiconductor device as defined in claim 1, wherein a Ball Limiting Metal is formed on the electrode pad.

* * * * *